US009005999B2

(12) United States Patent
Xu et al.

(10) Patent No.: US 9,005,999 B2
(45) Date of Patent: Apr. 14, 2015

(54) TEMPERATURE CONTROL OF CHEMICAL MECHANICAL POLISHING

(75) Inventors: Kun Xu, Fremont, CA (US); Jimin Zhang, San Jose, CA (US); David H. Mai, Palo Alto, CA (US); Stephen Jew, San Jose, CA (US); Shih-Haur Walters Shen, Hsin-Chu (TW); Zhihong Wang, Santa Clara, CA (US); Thomas H. Osterheld, Mountain View, CA (US); Wen-Chiang Tu, Mountain View, CA (US); Gary Ka Ho Lam, Santa Clara, CA (US); Tomohiko Kitajima, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 265 days.

(21) Appl. No.: 13/539,344

(22) Filed: Jun. 30, 2012

(65) Prior Publication Data

US 2014/0004626 A1   Jan. 2, 2014

(51) Int. Cl.
*H01L 21/00* (2006.01)
*H01L 21/302* (2006.01)
*H01L 21/304* (2006.01)

(52) U.S. Cl.
CPC ............ *H01L 21/302* (2013.01); *H01L 21/304* (2013.01)

(58) Field of Classification Search
CPC ..... H01L 22/12; H01L 22/26; H01L 21/3212; H01L 21/302; H01L 21/304; H01L 21/6062; B24B 37/013
USPC ........... 438/5, 7, 8, 9, 16, 689, 690, 691, 692, 438/693
See application file for complete search history.

(56) References Cited

U.S. PATENT DOCUMENTS

| 5,851,846 A | 12/1998 | Matsui et al. |
| 6,444,569 B2 | 9/2002 | Farkas et al. |
| 2002/0064971 A1 | 5/2002 | Shih et al. |
| 2002/0193050 A1 | 12/2002 | Sharan |
| 2003/0055526 A1 | 3/2003 | Avanzino et al. |
| 2007/0093064 A1* | 4/2007 | Fukushima et al. .......... 438/692 |
| 2007/0238395 A1 | 10/2007 | Kimura et al. |
| 2008/0032606 A1 | 2/2008 | Liu et al. |
| 2008/0090500 A1 | 4/2008 | Hellring et al. |
| 2009/0057264 A1* | 3/2009 | Mai et al. ........................ 216/13 |
| 2010/0015894 A1 | 1/2010 | Ho et al. |
| 2010/0279435 A1* | 11/2010 | Xu et al. ............................ 438/5 |

FOREIGN PATENT DOCUMENTS

WO   WO-2010126902   11/2010

OTHER PUBLICATIONS

International Search Report and Written Opinion dated Mar. 11, 2013 for PCT/US2012/048050.

* cited by examiner

*Primary Examiner* — Colleen A Matthews
*Assistant Examiner* — Quovaunda V Jefferson
(74) *Attorney, Agent, or Firm* — Patterson & Sheridan, LLP

(57) ABSTRACT

Methods for chemical mechanical polishing (CMP) of semiconductor substrates, and more particularly to temperature control during such chemical mechanical polishing are provided. In one aspect, the method comprises polishing the substrate with a polishing surface during a polishing process to remove a portion of the conductive material, repeatedly monitoring a temperature of the polishing surface during the polishing process, and exposing the polishing surface to a rate quench process in response to the monitored temperature so as to achieve a target value for the monitored temperature during the polishing process.

25 Claims, 10 Drawing Sheets

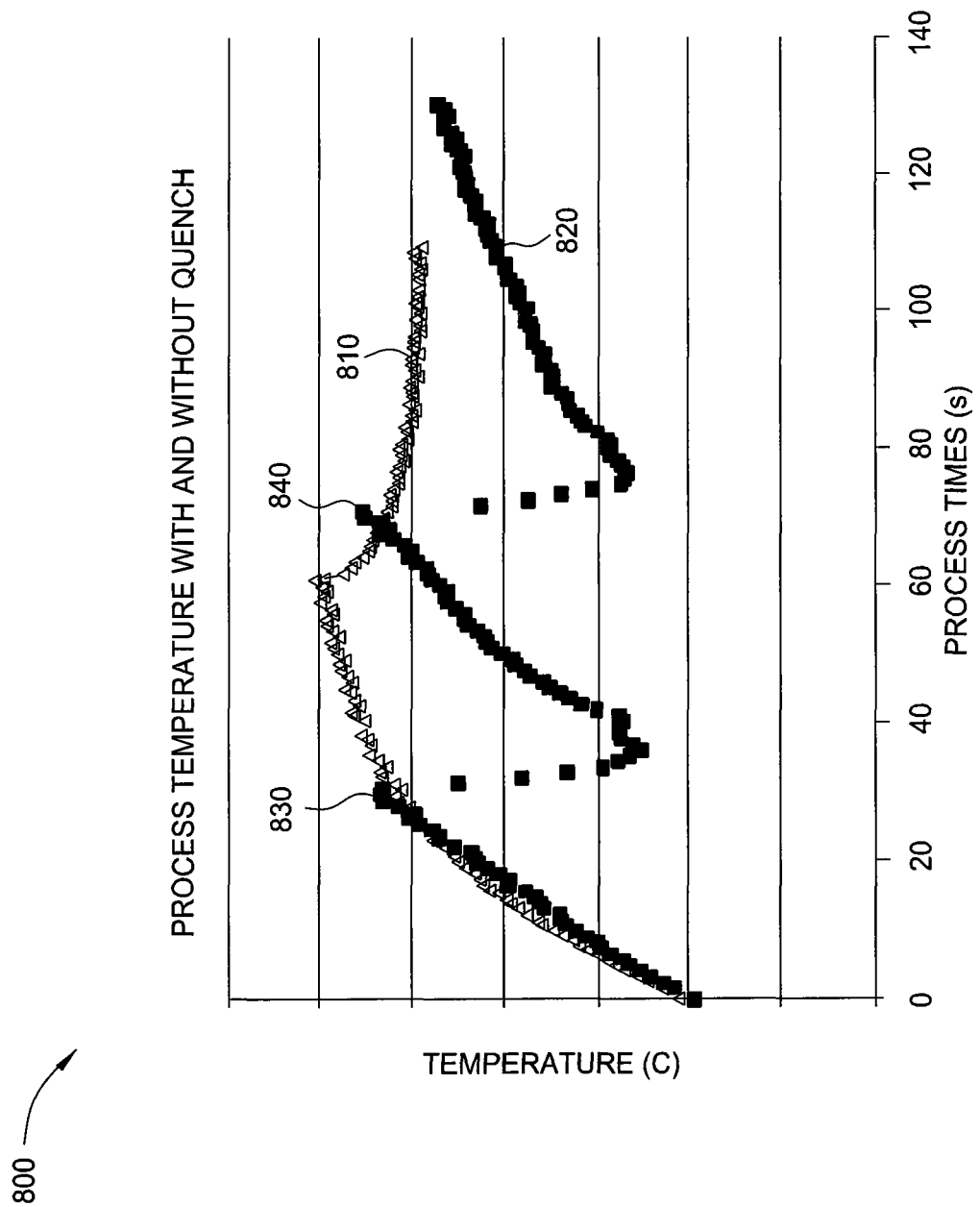

TEMPERATURE CONTROL OF CHEMICAL MECHANICAL POLISHING

BACKGROUND

1. Field

Embodiments of the present invention generally relate to a method and apparatus for chemical mechanical polishing (CMP) of semiconductor substrates, and more particularly to temperature control during such chemical mechanical polishing.

2. Description of the Related Art

Integrated circuits are typically formed on substrates, such as silicon wafers, by the sequential deposition of various layers such as conductive, semiconductor or insulating layers. After a layer is deposited, a photoresist coating can be applied on top of the layer. A photolithographic apparatus, which operates by focusing a light image on the coating, can be used to remove portions of the coating, leaving the photoresist coating on areas where circuitry features are to be formed. The substrate can then be etched to remove the uncoated portions of the layer, leaving the desired circuitry features.

As a series of layers are sequentially deposited and etched, the outer or uppermost surface of the substrate tends to become increasingly non-planar. This non-planar surface presents problems in the photolithographic steps of the integrated circuit fabrication process. For example, the ability to focus the light image on the photoresist layer using the photolithographic apparatus may be impaired if the maximum height difference between the peaks and valleys of the non-planar surface exceeds the depth of focus of the apparatus. Therefore, there is a need to periodically planarize the substrate surface.

Chemical mechanical polishing (CMP) is one accepted method of planarization. Chemical mechanical polishing typically includes mechanically abrading the substrate in a slurry that contains a chemically reactive agent. During polishing, the substrate is typically held against a polishing pad by a carrier head. The polishing pad may rotate. The carrier head may also rotate and move the substrate relative to the polishing pad. As a result of the motion between the carrier head and the polishing pad, chemicals, which can include a chemical solution or chemical slurry, planarize the non-planar substrate surface by chemical mechanical polishing.

The CMP process, designed to remove nonplanarity, nevertheless can lead to non-planar artifacts. For example, the fluid dynamics of the slurry, coupled with the mechanical aspects of the system can lead to turbulence variations across the polishing pad/substrate, proportional to the relative speed of rotation. These turbulence variations are believed to lead to erosion in the substrate which can result in deviations from planarity, contrary to the goal of the CMP. This erosion can be countered in part by also moving the substrate in relation to the CMP polishing pad, but such erosion is not entirely eliminated. Another defect or deviation in planarity which can arise from CMP is "dishing" or differential polishing and/or erosion which occurs between different material layers, typically material layers of different hardness. For example, when CMP breaks through an overlying hard layer (e.g., an oxide), an underlying layer of softer metal can be "dished." Consequently, there is a need in the art to improve the ability of CMP to planarize a substrate and to reduce non-planar side-effects of CMP such as erosion and dishing.

SUMMARY OF THE INVENTION

Embodiments of the present invention generally relate to a method and apparatus for chemical mechanical polishing (CMP) of semiconductor substrates, and more particularly to temperature control during such chemical mechanical polishing. In one embodiment, a method for chemical mechanical polishing (CMP) of a conductive material disposed on one or more substrates is provided that includes polishing the one or more substrates against a polishing surface in the presence of a polishing fluid during a polishing process to remove a portion of the conductive material; monitoring a temperature of the polishing surface during the polishing process; and exposing the polishing surface to a rate quench process in response to the monitored temperature so as to maintain the temperature of the polishing surface at a target value during the polishing process.

In another embodiment, a method for chemical mechanical polishing (CMP) of a conductive material disposed on one or more substrates is provided that includes polishing one or more substrates having a conductive material disposed over an underlying barrier material on a polishing surface of a polishing pad in the presence of a polishing fluid to remove a portion of the conductive material, the polishing pad supported on a first platen; monitoring a temperature of the polishing surface of the polishing pad while polishing the one or more substrates on the polishing pad; and exposing the polishing surface of the polishing pad to a rate quench process in response to the temperature of the polishing surface exceeding a target value while polishing the substrate on the polishing pad.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 is a plot depicting the effect of a quench process on temperature during a chemical mechanical polishing process.

Figure 1:
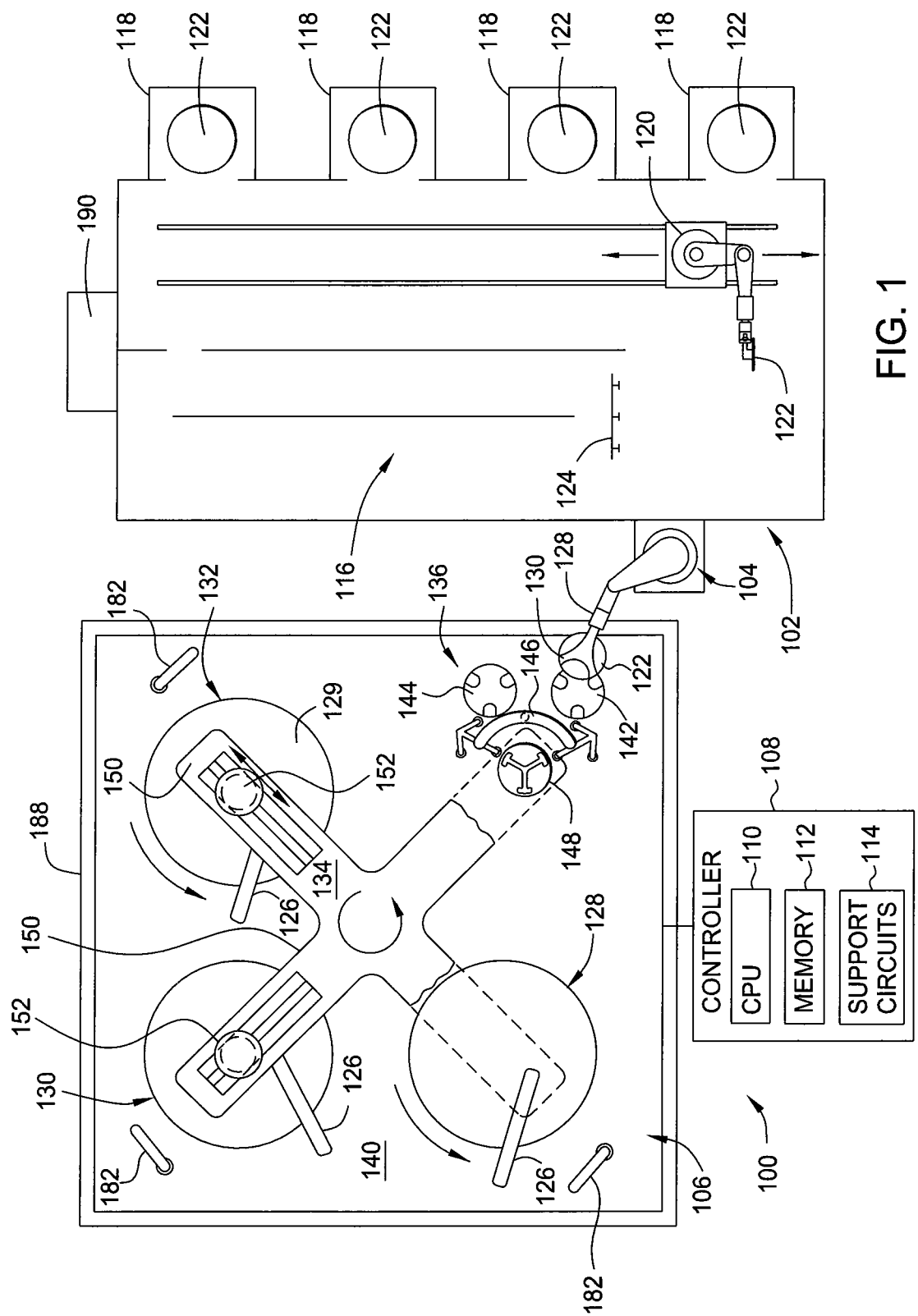
FIG. 1 is a plan view of a chemical mechanical planarizing system.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the invention described herein generally relate to methods and apparatus for chemical mechanical polishing of substrates in order to planarize such substrates. Applicants have discovered that the planarization efficacy of CMP processing relates to the temperature of the process and temperature variation during the process. In particular, it is believed that CMP side effects such as erosion and dishing are related to temperature and temperature variation during the CMP process. In particular, Applicants have discovered, for example in CMP of copper using a slurry with ammonium persulphate (APS) oxidizer, that dishing and erosion can depend on the temperature at the surface of a polishing pad and the temperature of the polishing slurry, where dishing is increased with decreasing temperature, and erosion is increased with increasing temperature. Accordingly, the apparatus and methods described below are directed towards controlling the average temperature and reducing temperature variation during CMP planarization of substrates, particularly towards a target temperature that improves planarization. The described methods and apparatus lead to improved planarization efficacy during CMP of substrates, with reduced side-effects such as erosion and dishing.

With improvements in system design and consumables (e.g., polishing slurries and polishing pads) combined with the demands for high productivity and faster throughput, copper CMP can achieve very high removal rates at lower pressures to accommodate advanced technology nodes. The consequence of such high removal rates is an increased concentration of by-products, higher temperature generation (sometimes in excess of 70 degrees Celsius) due to exothermic reactions, and increased friction on the wafer or substrate surface. Further, implementation of a one platen copper clear process and thicker copper film removal have exacerbated this phenomena. In addition, larger pad surfaces with diameters greater than thirty inches will inevitably be introduced which may lead to greater challenges to clean the polishing pad and the wafer. Higher temperatures, greater by-product concentration, and higher friction between the wafer and surface of the polishing pad have a negative impact on critical process performance parameters such as topography, resistivity and uniformity in metal lines, and defect performance. Also performance of the consumable components such as the pad surface, adhesives, and slurry components will degrade at extremely high temperatures.

In one embodiment of a quench process, e.g., a high flow high pressure deionized water (DIW) rinse, is performed in response to the monitored temperature in order to lower process temperatures, dilute CMP by-product concentration, and reduce the high torque that results from the high friction due to by-products and temperature. Proper temperature control has many benefits including maintaining slurry component integrity for proper surface passivation, lowering the risk of negative defect performance such as Cu line corrosion, lowering reaction rates for Rs control, maintaining pad surface properties such as asperity, and maintaining adhesive integrity. Diluting by-products lowers the risk of negative defect performance such as scratching, increases the concentration of passivating agents in the polishing slurry that would otherwise bind to by-products, and improves process stability by keeping the pad, polishing head, and wafer cleaner. These aspects are critical during the copper clear step in copper CMP film removal.

The quench process may be targeted at different film thicknesses monitored in-situ using eddy current technology and duration of the quench will vary depending on many factors such as consumables used, removal rate, single or multi-head polish (e.g., multiple substrates simultaneously polished by a single polishing pad), process temperature, and pad surface area. Other quench processes may be performed to effectively decrease by-products, lower temperature, lower friction, and help to maintain consumable integrity. These methods include, but are not limited to conduction or convection methods like heat exchangers or gas flow, flow of chilled liquids, or the flow of other chemicals. Also, the embodiments described herein may be applied to CMP of other films including metals, dielectrics, barriers, or any other substrate used in the process flow of fabricating integrated circuit chips. The embodiments described herein may be applied to single or multi-head polishing on a single platen and are also pertinent to polishing pads currently with 30 inch radius or larger.

Embodiments described herein will be described below in reference to a planarizing process and composition that can be carried out using chemical mechanical polishing process equipment, such as MIRRA™, MIRRA MESA™, REFLEXION®, REFLEXION LK™, and REFLEXION® GT™ chemical mechanical planarizing systems, available from Applied Materials, Inc. of Santa Clara, Calif. Other planarizing modules, including those that use processing pads, planarizing webs, or a combination thereof, and those that move a substrate relative to a planarizing surface in a rotational, linear, or other planar motion may also be adapted to benefit from the embodiments described herein. In addition, any system enabling chemical mechanical polishing using the methods or compositions described herein can be used to advantage. The following apparatus description is illustrative and should not be construed or interpreted as limiting the scope of the embodiments described herein.

FIG. 1 is a plan view of one embodiment of a planarization system 100 having an apparatus for chemical mechanical processing of a substrate. The system 100 generally comprises a factory interface 102, a loading robot 104, and a planarizing module 106. The loading robot 104 is disposed to facilitate the transfer of substrates 122 between the factory interface 102 and the planarizing module 106.

A controller 108 is provided to facilitate control and integration of the modules of the system 100. The controller 108 comprises a central processing unit (CPU) 110, a memory 112, and support circuits 114. The controller 108 is coupled to the various components of the system 100 to facilitate control of the planarizing, cleaning, and transfer processes.

The factory interface 102 generally includes a metrology module 190, a cleaning module 116 and one or more substrate cassettes 118. An interface robot 120 is employed to transfer substrates 122 between the substrate cassettes 118, the cleaning module 116, and an input module 124. The input module 124 is positioned to facilitate transfer of substrates 122 between the planarizing module 106 and the factory interface 102 by grippers, for example, vacuum grippers or mechanical clamps.

The metrology module 190 may be a non-destructive measuring device suitable for providing a metric indicative of the thickness profile of a substrate. The metrology module 190 may include eddy current sensors, an interferometer, a capacitance sensor and other suitable devices. Examples of suitable metrology modules include ISCAN® and IMAP™ substrate metrology modules, available from Applied Materials, Inc. The metrology module 190 provides the metric to the controller 108 wherein a target removal profile is determined for the specific thickness profile measured from the substrate.

The planarizing module 106 includes at least a first chemical mechanical planarizing (CMP) station 128, disposed in an environmentally controlled enclosure 188. In the embodiment depicted in FIG. 1, the planarizing module 106 includes the first CMP station 128, a second CMP station 130 and a third CMP station 132. Bulk removal of conductive material disposed on the substrate 122 may be performed through a chemical mechanical polishing process at the first CMP station 128. In one embodiment, the bulk removal of conductive material may be a multi-step process. After the bulk material removal at the first CMP station 128, the remaining conductive material or residual conductive material may be cleared from the substrate at the second CMP station 130 in a single-step or multi-step chemical mechanical polishing process, wherein part of the multi-step process is configured to remove residual conductive material. The third CMP station 132 may be used to polish a barrier layer. In one embodiment, both the bulk material removal and residual material removal may be performed at a single station. In another embodiment, removal of the bulk conductive material and the residual conductive material my occur at the same station. Alternatively, more than one CMP station may be utilized to perform the multi-step removal process after the bulk removal process is performed at a different station.

The exemplary planarizing module 106 also includes a transfer station 136 and a carousel 134 that are disposed on an upper or first side of a machine base 140. In one embodiment, the transfer station 136 includes an input buffer station 142, an output buffer station 144, a transfer robot 146, and a load cup assembly 148. The input buffer station 142 receives substrates from the factory interface 102 by means of the loading robot 104. The loading robot 104 is also utilized to return polished substrates from the output buffer station 144 to the factory interface 102. The transfer robot 146 is utilized to move substrates between the buffer stations 142, 144 and the load cup assembly 148.

In one embodiment, the transfer robot 146 includes two gripper assemblies, each having pneumatic gripper fingers that hold the substrate by the substrate's edge. The transfer robot 146 may simultaneously transfer a substrate to be processed from the input buffer station 142 to the load cup assembly 148 while transferring a processed substrate from the load cup assembly 148 to the output buffer station 144.

The carousel 134 is centrally disposed over the base 140. The carousel 134 typically includes a plurality of arms 150, each supporting a carrier head assembly 152. Two of the arms 150 depicted in FIG. 1 are shown in phantom such that the transfer station 136 and a planarizing surface 129 of the first CMP station 128 may be seen. The carousel 134 is indexable such that the carrier head assemblies 152 may be moved between the planarizing stations 128, 130, and 132 and the transfer station 136. A conditioning device 182 is disposed on the base 140 adjacent each of the planarizing stations 128, 130, and 132. The conditioning device 182 periodically conditions the planarizing material disposed in the stations 128, 130, and 132 to maintain uniform planarizing results.

Figure 2:
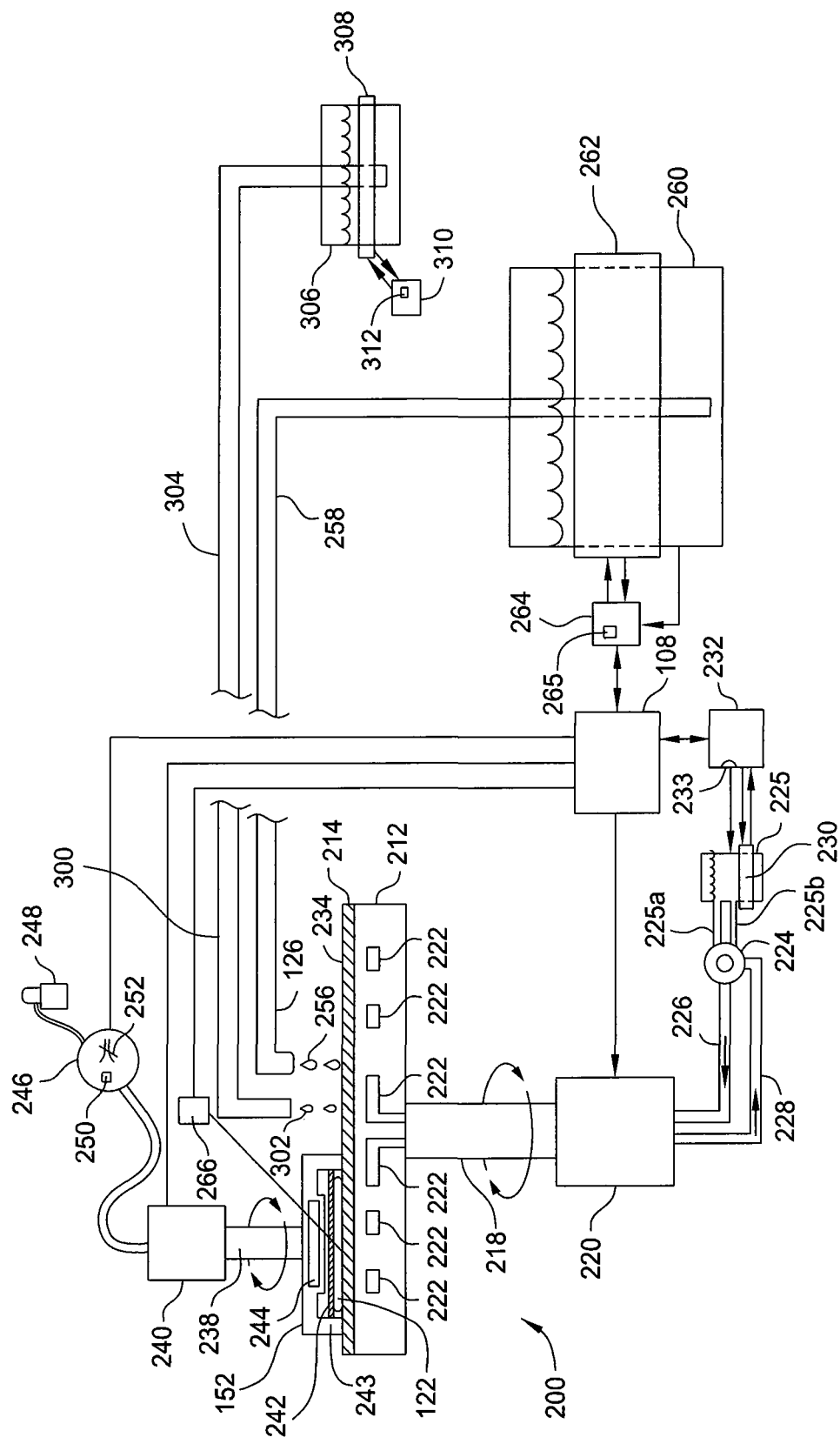
FIG. 2 is a block diagram of the main components of a chemical mechanical polishing apparatus as described herein.

Referring to FIG. 2, a chemical mechanical polishing (CMP) apparatus 200 includes a flat platen 212 with an attached or applied polishing pad 214. The CMP apparatus 200 may be any of the planarizing stations 128, 130, and 132 depicted in FIG. 1. Platen 212 is mounted on the end of a drive shaft 218 of a motor 220, which rotates platen 212 during a polishing operation. Platen 212 may be made of a thermally conductive material, e.g., aluminum, and can include within its interior an array of fluid circulation channels 222 through which a coolant or heating fluid can be circulated during use. A pump 224 collects fluid from a reserve tank 225 through a reservoir outlet tube 225a. Pump 224 supplies fluid to channels 222 via an inlet tube 226 and collects the fluid flowing out of circulation channels 222 through an outlet tube 228. Pump 224 returns fluid to reserve tank 225 through reservoir inlet tube 225b. A heating/cooling element 230 encircling reserve tank 225 can heat or cool the fluid flowing through the circulation system, e.g., to a predetermined temperature, thereby controlling the temperature of platen 212 during the polishing operation. The heating/cooling element can include heating and cooling elements known to the art. For example, a heating element can include a resistive electrical heating element, an infrared heating element, a heat exchanging system which directs a heated fluid through an exchange jacket or coil at reserve tank 225, and the like. A cooling element can include a heat exchanging system which directs a cooled fluid through an exchange jacket or coil at the reserve tank 225, a Peltier element, and the like. A heating or cooling element can be employed to heat or cool platen 212 and a substrate at platen 212. For example, an infrared heating element can be employed to heat platen 212 and a substrate at platen 212. The infrared heating element can be positioned over the platen to direct infrared heat onto the polishing pad. A temperature controller 232, which includes a temperature sensor 233 for monitoring the temperature of the fluid, is electrically connected to heating/cooling element 230. Based on the signal supplied by sensor 233, controller 232 operates heating/cooling element 230, for example, to bring the fluid to a predetermined temperature.

A carrier head assembly 152 faces platen 212 and holds the substrate during the polishing operation. Carrier head assembly 152 is typically mounted on the end of a drive shaft 238 of a second motor 240, which can rotate head 152 during polishing and at the same time that platen 212 is also rotating. Various implementations may further include a translation motor that can move carrier head assembly 152 laterally over the surface of polishing pad 214, for example, while carrier head assembly 152 is rotating. Although a single carrier head assembly 152 is shown, it should be understood that the embodiments described herein are also applicable to polishing systems with multiple carrier heads per platen that may simultaneously polish a plurality of substrates on a polishing surface. One exemplary system is depicted in U.S. patent application Ser. No. 12/420,996, titled A POLISHING SYSTEM HAVING A TRACK, filed Apr. 9, 2009 and now published as US 2009/0258574 which is herein incorporated by reference in its entirety.

Carrier head assembly 152 can include a support assembly, e.g., piston-like support assembly 242, which can be surrounded by an annular retaining ring 243. Support assembly 242 has a substrate-receiving surface, such as a flexible membrane, inside of the central open region within retaining ring 243. A pressurizable chamber 244 behind support assembly 242 controls the position of the substrate-receiving surface of support assembly 242. By adjusting the pressure within chamber 244, the pressure with which the substrate is pressed against the polishing pad can be controlled. More specifically, an increase in the pressure within chamber 244 causes support assembly 242 to push the substrate against polishing pad 214 with greater force, and a decrease in the pressure within chamber 244 reduces that force.

This document presents typical elements of the CMP apparatus that relate to the invention described herein. Additional details about the structure and operation of typical CMP are known, for example, U.S. Pat. No. 5,738,574, incorporated herein by reference in its entirety.

In various implementations, a pressure controller 246 in cooperation with source of pressure, e.g., a compressed air source 248 (e.g. container of pressurized air or a air pump) can control the pressure in chamber 244. Pressure controller 246 can include a pressure sensor 250 for sensing the pressure in chamber 244. Pressure sensor 250 is depicted within pressure controller 246, but may alternatively be located at any place from which the pressure within the chamber 244 could be effectively monitored. Pressure controller 246 operates a valve, e.g., electronically controllable valve 252, to flow air into chamber 244 and to release air from chamber 244, thereby controlling the pressure within chamber 244.

To perform the polishing operation, a supply delivery tube 126 delivers a polishing liquid 256 to the surface of polishing pad 214. In certain embodiments, the supply delivery tube 126 may include a plurality of rinse outlet ports arranged to uniformly deliver a spray and/or stream of rinsing fluid to the surface of the polishing pad 214. In various implementations, polishing pad 214 comprises an abrasive, and polishing liquid 256 is typically a mixture of water and chemicals that aid in the polishing process. In some implementations, the polishing pad does not contain an abrasive, and polishing liquid 256 may contain an abrasive in a chemical mixture. In several implementations, both polishing pad 214 and polishing liquid 256 can include an abrasive.

A pipe 258 connects delivery tube 126 to a supply reservoir 260. A heating/cooling element 262 encircles reservoir 260 and provides a way of heating and/or cooling the polishing liquid, e.g., to a desired constant temperature, before it is delivered to the polishing pad. A temperature controller 264, which operates heating/cooling element 262, uses a thermal sensor 265 to monitor the temperature of the slurry and adjusts the power delivered to heating/cooling element 262 to control the slurry temperature.

An IR sensor 266 located at polishing surface 234 is oriented to sense the temperature of polishing surface 234 adjacent to carrier head assembly 152, for example, when carrier head assembly 152 is in contact with polishing surface 234. A programmed computer or controller 108 can monitor the output of IR sensor 266 and can control pump 224, temperature controller 232, pressure controller 246, and temperature controller 264, as described in greater detail below.

The polishing system can also include a pad rinse system, such as a water delivery tube 300 that delivers deionized water 302 to the surface 234 of polishing pad 214. A pipe 304 connects delivery tube 300 to deionized water tank 306. A heating/cooling element 308 encircles tank 306 and provides a way of heating and/or cooling the water before it is delivered to polishing pad 214. A temperature controller 310, which operates heating/cooling element 308, uses a thermal sensor 312 to monitor the temperature of the water and adjusts the power delivered to heating/cooling element 308 to achieve the desired water temperature. Although the water delivery tube 300 and the slurry delivery tube 126 are depicted as separate elements, it should be understood that a single delivery tube may perform both functions of water delivery and slurry delivery.

During polishing, the carrier head assembly 152 holds the substrate 122 against polishing surface 234 while motor 220 rotates platen 212 and motor 240 rotates carrier head assembly 152. The delivery tube 126 delivers a mixture of water and a chemical to polishing surface 234. After polishing, debris and excess slurry can be rinsed from the pad surface by water from the water delivery tube 300.

During the polishing process, which is partially chemical in nature, the polishing rate depends on the temperature of substrate 122 and polishing surface 234. More specifically, the polishing rate increases when the temperature increases and it decreases when the temperature decreases. Further, it is believed that undesirable side-effects such as erosion and dishing increase with temperature variation and/or temperature deviation, where dishing is increased with decreasing temperature, and erosion is increased with increasing temperature. To achieve a more uniform and repeatable polishing rate, and to reduce side effects such as erosion and dishing, temperature in CMP can be regulated, particularly towards a target temperature that improves planarization, in one or more ways as follows.

First, the temperature at polishing surface 234 can be partly regulated by controlling the temperature of the fluid circulating through fluid circulating channels 222. Because the platen is made of a thermally conductive material, the temperature of the fluid in the channels can directly and quickly influence the temperature of the polishing pad. Controller 108 can set a target temperature of temperature controller 232, then adjusts the power delivered to heating/cooling element 230 to control the temperature of the fluid, e.g., holding it at the target temperature. Thus, the target temperature can be reached, and temperature variations can be reduced.

The temperature at polishing surface 234 may also be regulated by controlling the temperature of liquid that is delivered to polishing surface 234. Polishing pad 214 may have insulating properties. Therefore, even if the temperature of platen 212 is controlled as described above, it may not provide as much control of the temperature of polishing surface 234 as desired. Additional temperature control at polishing surface 234 may include delivering liquid at a controlled temperature to polishing surface 234, such as polishing liquid 256 (such as a polishing slurry or other liquid), delivered through delivery tube 126. Temperature controller 264 senses the temperature of the polishing fluid in the supply reservoir 260. Controller 108 can set a target temperature, and temperature controller 264 can then adjust the power delivered to heating/cooling element 262 to control the temperature of the liquid, e.g., to the target temperature. Thus, the target temperature can be reached, and temperature variations can be reduced.

A second liquid delivered to surface 234 can be deionized water 302, delivered through water delivery tube 300. Temperature controller 310 can sense the temperature of the water in water tank 306. Temperature controller 310 can adjust the power delivered to heating/cooling element 308 to control the temperature of the water, e.g., to a pre-set target temperature. Water delivery tube 300 delivers deionized water, e.g., at a target temperature, to polishing surface 234, for example, for several seconds prior to the initiation of a polishing step. The polishing surface 234 can thereby be brought to the target temperature when the polishing step begins. This procedure can improve process repeatability. Although depicted as separate units in FIG. 2, it should be understood that temperature controller 232, temperature controller 264, temperature controller 310, and pressure controller 246 may individually be part of the controller 108 depicted in FIG. 1.

Figure 3:
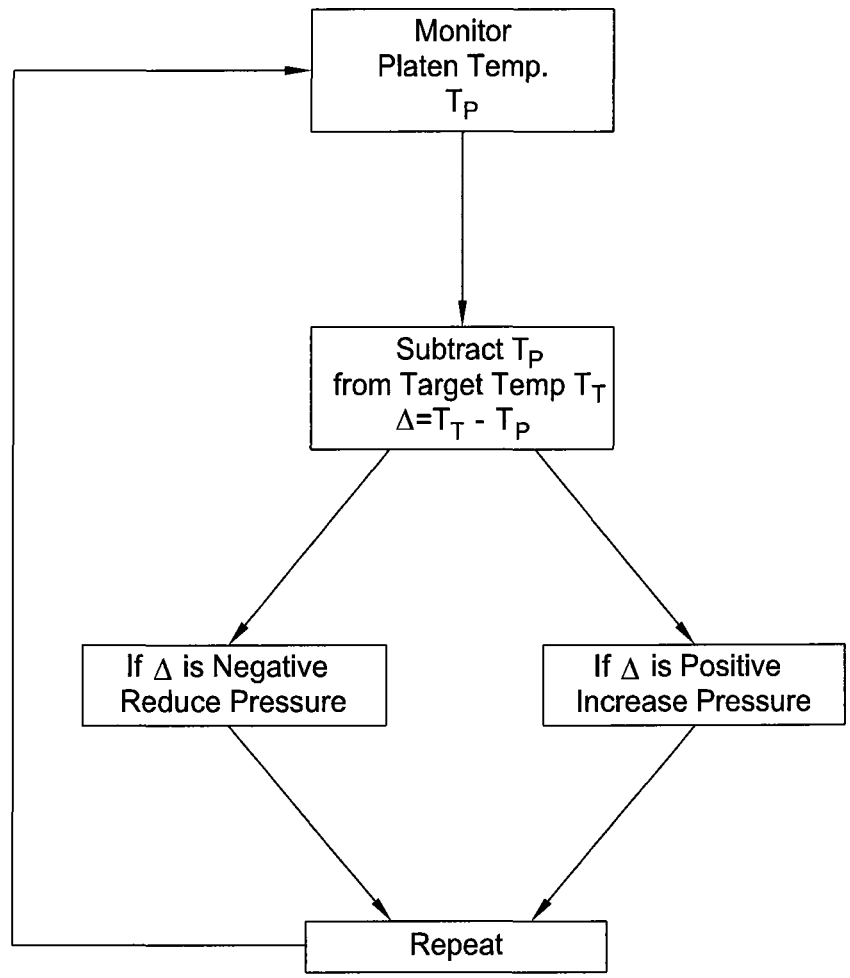
FIG. 3 is a block diagram of a control system for controlling the carrier head assembly in a polishing apparatus, such as the polishing apparatus of FIG. 2.

Referring also to FIG. 3, the temperature of substrate 122 during a CMP process can also be controlled by controlling the pressure with which substrate 122 is pressed against polishing surface 234 during polishing. The pressure between substrate 122 and surface 234 in part determines the friction. Increasing the pressure results in a higher friction and thus a higher temperature; conversely, decreasing the pressure results in lower friction and thus a lower temperature. Thus, controller 108 can vary the pressure in order control the temperature of polishing surface 234, for example, towards a target temperature or to reduce temperature variation.

The pressure which substrate 122 exerts against polishing surface 234 during processing can be controlled in the following manner. Using IR sensor 266, controller 108 can monitor the temperature of polishing surface 234. Controller 108 can be programmed to compare the temperature at sensor 266 to a predetermined target temperature profile. If the measured temperature is above the target temperature profile, controller 108 causes pressure controller 246 to reduce the pressure applied to substrate 122, e.g. by reducing the pressure in the chamber 244 in carrier head assembly 152 (see FIG. 2). If the measured temperature is below the target temperature profile, controller 108 can cause pressure controller 246 to increase the pressure applied to substrate 122 by increasing the pressure in chamber 244. Thus, controller 108 can control the temperature, for example at a predetermined target value throughout the polishing process. This process can be as short as 1-2 minutes for a given substrate.

Typically, during a polishing run the temperature of polishing surface 234 will increase until a stable temperature is reached. One approach for establishing the target temperature to be used by controller 108 is to monitor a "good" polishing run to examine temperature variation throughout the run as a function of time, and at a fixed pressure. This measured temperature can be selected as the target temperature for similar runs. That is, controller 108 simply controls the pressure applied to the substrate for each run so that the temperature of the polishing surface follows the measured curve of a good polishing run. Thus, controller 108 tends to ensure that the averaged polishing rate of each polishing run is repeatable, thereby providing consistent results. A "good polishing run" occurs when temperature control leads to effective planarization with an acceptable amount of dishing and/or erosion.

The temperature of substrate 122 during a CMP process can also be controlled by controlling the relative velocity with which platen 212 and carrier head assembly 152 rotate with respect to each other. The friction between substrate 122 and surface 234 is determined in part by the relative velocity between substrate 122 and surface 234. The relationship between the relative velocity and friction can be calculated. Then, the relative velocity can be adjusted to decrease friction if the temperature of polishing surface 234 is too high, or to increase friction if the temperature of polishing surface 234 is too low. For example, controller 108 can vary rotational velocities generated by motor 220 and/or motor 240 in order to control the temperature of polishing surface 234, e.g., towards a target temperature.

The relative velocity between platen 212 and carrier head assembly 152 can be controlled in the following manner. Using IR sensor 266, controller 108 monitors the temperature of polishing surface 234. Controller 108 can be programmed to compare the sensed temperature to a predetermined target temperature profile. If the measured temperature is above or below the target temperature profile, controller 108 can proportionately change the rotational velocity of motor 220 and/or motor 240. Thus, controller 108 controls the temperature, e.g., at a predetermined target value during the polishing process.

Typically, during a polishing run the temperature of polishing surface 234 will increase until a stable temperature is reached. In various implementations, the target temperature used by controller 108 can be selected by monitoring a "good" polishing run to examine temperature variation throughout the run as a function of time, while at a fixed relative velocity of substrate 122 to polishing surface 234. This measured temperature can be selected as the target temperature for similar runs. Thus, controller 108 can control the relative velocity between substrate 122 and polishing surface 234, so that the temperature of the polishing surface follows the measured curve of a good polishing run. Thus, controller 108 tends to ensure that the averaged polishing rate of each polishing run is repeatable, and thus leads to consistent results. A "good polishing run" occurs when temperature control leads to effective planarization with reduced dishing and/or erosion.

Figure 4:
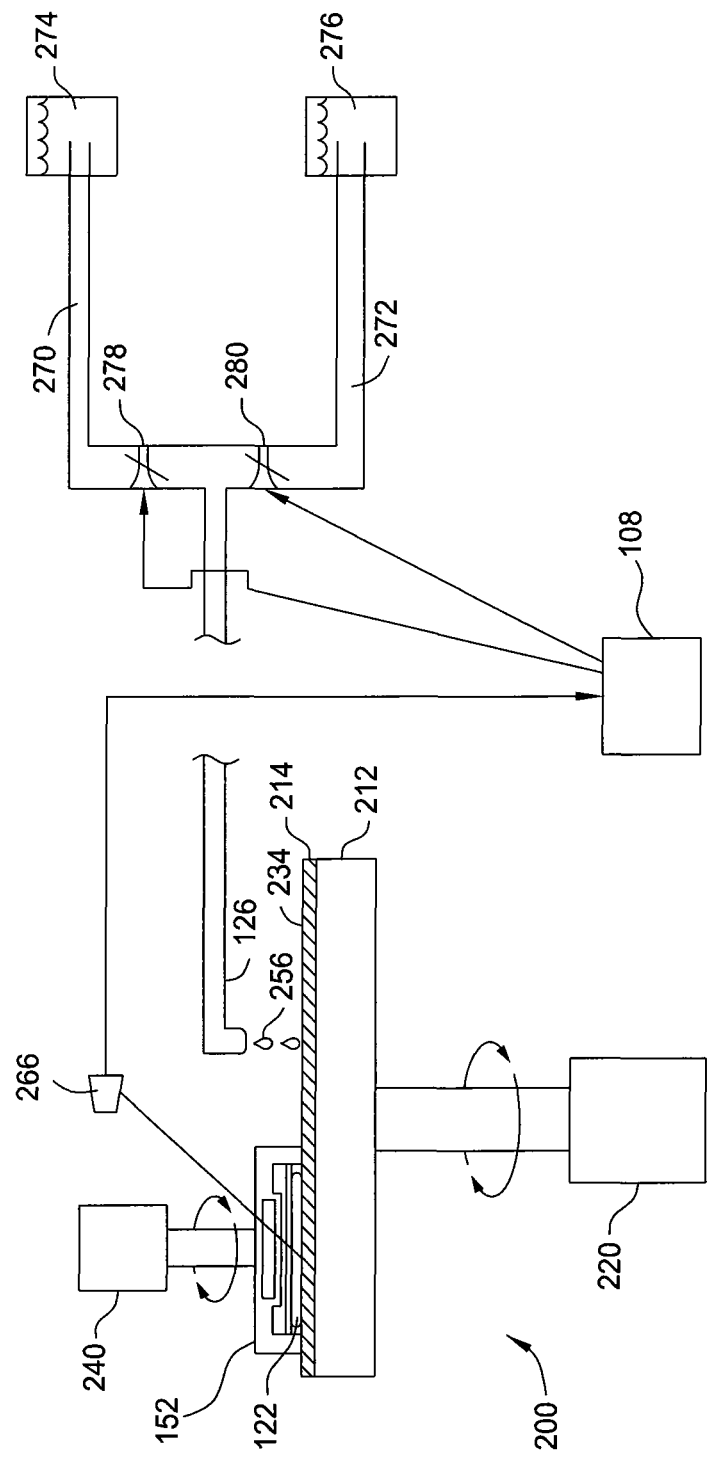
FIG. 4 is a block diagram of the main components of a chemical mechanical polishing system constructed according to various implementations of the present invention.

Referring to FIG. 4, the temperature of substrate 122 during a CMP process can be controlled by controlling the composition of polishing liquid 256. Polishing liquid 256 is delivered to polishing surface 234 by supply/rinse delivery tube 126. Pipes 270 and 272 connect the delivery tube 126 to chemical solution reservoir 274 and water tank 276, respectively. Valves 278 and 280 control flow of liquid from pipes 270 and 272 to the tube 126, respectively. Controller 108 can control valves 278 and 280. The temperature of substrate 122 can depend in part on the rate of reaction of polishing liquid 256 with a surface of substrate 122. The rate of reaction of polishing liquid 256 with a surface of substrate 122 can be directly proportional to the polishing rate. Increasing the concentration of chemical solution can increase the rate of reaction, and hence can increase the polishing rate. Decreasing the concentration of chemical solution can decrease the rate of reaction, and hence can decrease the polishing rate.

The composition of polishing liquid 256 can be controlled in the following manner. Using IR sensor 266, controller 108 can monitor the temperature of polishing surface 234. Controller 108 can be programmed to compare the sensed temperature to a predetermined target temperature profile. If the measured temperature is above the target temperature profile, controller 108 can adjust valve 278 to decrease the flow of chemical solution from chemical solution reservoir 274. Alternatively, controller 108 can adjust valve 280 to increase the flow of water from water tank 276. This adjustment or adjustments can decrease the concentration of the chemical solution on polishing surface 234, thus decreasing the polishing rate. On the other hand, if the measured temperature is below the target temperature profile, controller 108 can adjust valve 278 to increase the flow of chemical solution from chemical solution reservoir 274. Alternatively, controller 108 can adjust valve 280 to decrease the flow of water from water tank 276. This adjustment or adjustments can increase the concentration of the chemical solution on polishing surface 234, thus increasing the polishing rate.

Typically, during a polishing run the temperature of polishing surface 234 will increase until a stable temperature is reached. In various implementations, the target temperature used by controller 108 can be established by monitoring a "good" polishing run to examine temperature variation throughout the run as a function of time, and with a fixed concentration of chemical solution in water. This measured temperature can be selected as the target temperature for similar runs. Thus, controller 108 can control the concentration of the chemical solution in water, so that the temperature of the polishing surface follows the measured curve of a good polishing run. Controller 108 thus tends to ensure that the averaged polishing rate of each polishing run repeatable, leading to consistent results. A "good polishing run" occurs when temperature control leads to effective planarization with reduced dishing and/or erosion. If the measured temperature varies from the target temperature by more than a threshold amount, one or more of the polishing parameters, e.g., the pressure on the substrate, pressure on the retaining ring and/or slurry flow rate, can be adjusted to bring the temperature back toward the target temperature. The target temperature can be a constant through the polishing process. Moreover, the actual polishing rate can be allowed to drift during polishing, i.e., the feedback loop for the polishing parameters is based on keeping the temperature constant rather than keeping the polishing rate constant.

Other embodiments are within the following claims. For example, in systems in which coolant can be delivered to the platen to regulate the temperature of the polishing surface, the platen can be made of any appropriate thermally conducting material, besides aluminum as described above. In addition, instead of measuring the temperature of the polishing surface with an IR monitor, other known techniques for measuring the temperature of the polishing surface can be employed, e.g. a thermocouple installed in the platen or embedded in the polishing pad. Also, other ways of controlling the pressure between the substrate and the polishing pad may be employed. For example, rather than applying pressure to the backside of the substrate, the entire carrier head assembly can be moved vertically by an actuator (e.g., a pneumatic actuator, electromagnetic actuator, or the like) to control the pressure on the substrate. Furthermore, the temperature of the polishing liquid or water delivered to the polishing surface can be controlled by heating or cooling elements placed at locations in the delivery systems other than the locations described. In addition, liquid may be delivered to the polishing surfaces through multiple delivery tubes, with an independent temperature controller controlling the temperature of the liquid in each tube.

A multi-step metal polishing process, e.g., copper polishing, can include a first polishing step in which bulk polishing of the copper layer is performed at a first platen with a first polishing pad with or without temperature control but using an in-situ monitor to halt the polishing step, and a second polishing step in which the barrier layer is exposed and/or removed and using the temperature control procedure discussed above.

Figure 5A:
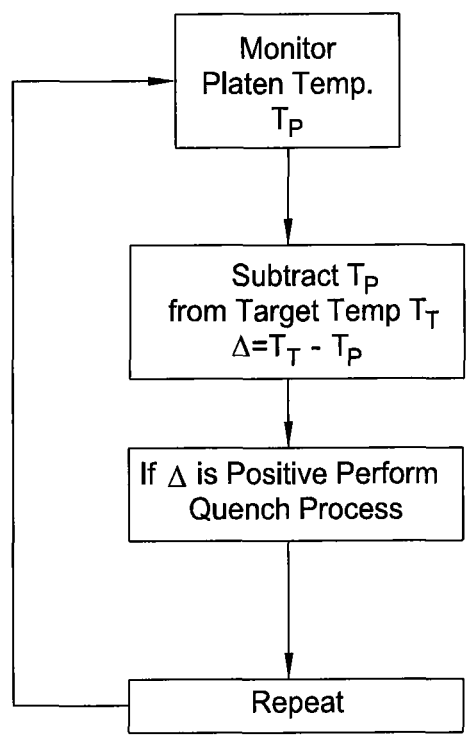
FIG. 5A is a block diagram of a control system for monitoring temperature in a polishing apparatus, such as the polishing apparatus of FIG. 2.

FIG. 5A is a block diagram of a control system for monitoring temperature in a polishing apparatus, such as the polishing apparatus of FIG. 2. Referring to FIG. 5A, the temperature of substrate 122 during a CMP process can also be controlled by controlling the temperature of the polishing surface 234 against which the substrate 122 is pressed during polishing. In certain embodiments, the temperature of the polishing surface 234 may be controlled by exposing the polishing surface 234 to a rate quench process in response to the monitored temperature so as to achieve a target value for the monitored temperature during the polishing process. Performing a rate quench process on the polishing surface 234 results in a decrease in the temperature of the polishing surface 234 and correspondingly decreases the temperature of the substrate 122. Thus, controller 108 can vary the application of the rate quench process in order control the temperature of polishing surface 234, for example, towards a target value such as a target value temperature or to reduce temperature variation. The target value may be determined by several factors. One exemplary factor is the type of polishing slurry used. The target value may be 50 degrees Celsius or less. In certain embodiments, the temperature target value may be a range that is lower than a certain chosen value such as being less than 50 degrees Celsius. It may be desirable to bring the temperature much lower such as 20 degrees Celsius and provide a large buffer (of time) before the process would again approach the target value.

Application of the rate quench process to the polishing surface 234 during processing can be controlled in the following manner. Using IR sensor 266, controller 108 can monitor the temperature of polishing surface 234. Controller 108 can be programmed to compare the temperature at sensor 266 to a predetermined target temperature profile. If the measured temperature is above the target temperature profile, controller 108 causes the application of the rate quench process to reduce the temperature of the polishing surface 234. If the measured temperature is below the target temperature profile, controller 108 can cause pressure controller 246 to increase the pressure applied to substrate 122 by increasing the pressure in chamber 244. If the measured temperature is below the target temperature profile, controller 108 can apply a heated fluid (e.g., heated DI water or polishing slurry) directly to the polishing surface 234 or heat the polishing surface 234 through heat conduction/convection. Thus, controller 108 can control the temperature, for example at a predetermined target value throughout the polishing process.

The rate quench process reduces the concentration of polishing by-products, such as metal ions, on the processing surface 234. A slightly center thin to edge thick profile is desirable after removal of the first portion of the bulk conductive material. However, at various points throughout the polishing process, the concentration of polishing by-products, e.g., copper ions, on the polishing pad 214 and in the polishing slurry is generally very high. This high concentration of metal ions in the polishing slurry consumes the passivation agent thus reducing the amount of passivation agent available to passivate and protect the copper lines and topography. As a result, this high concentration of metal ions must be reduced in order to achieve a uniform polish.

The rate quench process may comprise adding a rinsing agent to the polishing slurry to dilute the concentration of polishing by-products in the polishing slurry, increasing the flow rate of the polishing slurry, rinsing the polishing pad, and combinations thereof.

In one embodiment, the rate quench process may be accomplished by adding a rinsing agent to the polishing slurry to dilute the concentration of metal ions in the polishing slurry. In one embodiment, the rinsing agent may be delivered to the polishing slurry using water delivery tube 300, the supply delivery tube 126 or distributed slurry dispense arm (DSDA) with the ability to deliver both polishing slurry and rinsing agent to the surface of the polishing pad located adjacent to the first CMP station 128. In one embodiment, the rinsing agent comprises distilled water (DIW). In one embodiment the flow rate of the rinsing agent may be between about 300 ml/minute and about 12 liters/minute, for example, about 500 ml/minute. In one embodiment the flow rate of the rinsing agent may be between about 300 ml/minute and about 1,000 mL/minute. In one embodiment, the rinsing agent may be delivered using a high pressure rinse having a flow rate between about 1 liter/minute and about 7 liters/minute.

In one embodiment, the rate quench process may comprise increasing the flow rate of the polishing slurry. In one embodiment the flow rate of the polishing slurry may be between about 300 ml/min and about 500 ml/min.

The water delivery tube 300, supply delivery tube 126 or distributed slurry dispense arm (DSDA) located adjacent to the first CMP station 128 may be used to perform the rate quench step. The rate quench step may be performed at any point during the polishing process where the temperature of the polishing surface 34 rises above the target temperature. For example, the rate quench step may be performed prior to, during, or after at least one of the following: removal of the bulk conductive material, first copper breakthrough, and removal of the residual conductive material. Copper inhibitor additives present in the slurry passivate the conductive layer or copper but the copper inhibitor is also consumed by copper ions. If the concentration of copper ions is high then copper inhibitor concentration will be low and coverage of the wafer will be poor leading to poor copper passivation and high topography at copper breakthrough. The supply delivery tube 126 promotes good copper inhibitor coverage of the wafer and also more effectively dilutes the copper ion concentration.

During the rate quench process, the polishing down force may be reduced to about 0.5 psi. The reduced polishing down force is applied so that copper inhibitor from the polishing slurry more efficiently contacts the substrate and also helps remove polishing by-products from the substrate surface.

The rate quench process may be ceased when the monitored temperature is below the target value.

Figure 5B:
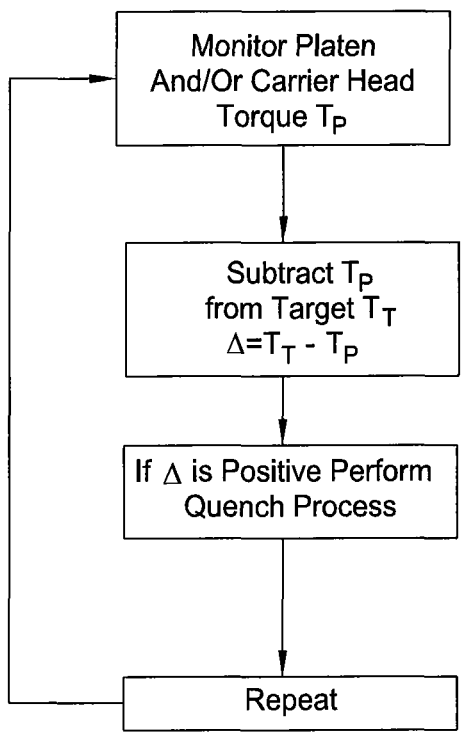
FIG. 5B is a block diagram of a control system for monitoring torque in a polishing apparatus, such as the polishing apparatus of FIG. 2.

FIG. 5B is a block diagram of a control system for monitoring torque in a polishing apparatus, such as the polishing apparatus of FIG. 2. Referring to FIG. 5B, the temperature of substrate 122 during a CMP process can also be controlled by controlling the torque of the platen 212 and/or carrier head assembly 152. Not to be bound by theory but it is believed that higher temperature usually results from higher removal rate and greater by-product generation and the accompanying greater friction will lead to higher torque. In certain embodiments, the torque of the platen 212 and/or carrier head assembly 152 may be controlled by exposing the polishing surface 234 to a rate quench process in response to the monitored torque so as to achieve a target value for the monitored torque during the polishing process. Performing a rate quench process on the polishing surface 234 results in a reduction in the high torque resulting from friction due to increased by-products and the increased temperature of the polishing surface 234. A decrease in torque leads to a decrease in the temperature of the polishing surface 234 and corresponding decrease in the temperature of the substrate 122. Thus, controller 108 can vary the application of the rate quench process in order control the torque of the platen 212 and/or carrier head assembly 152, for example, towards a target torque.

Application of the rate quench process to the polishing surface 234 during processing can be controlled in the following manner. By monitoring the current of motor 220, controller 108 can monitor the torque of the platen 212 and/or carrier head assembly 152. Controller 108 can be programmed to compare the torque to a predetermined target torque profile. If the measured temperature is above the target torque profile, controller 108 causes the application of the rate quench process to reduce the torque of the platen 212 and/or carrier head assembly 152. Thus, controller 108 can control the temperature, for example at a predetermined target value throughout the polishing process. The target torque value may be dependent on factors such as the size of the motor and the weight and resistance of what needs to be moved/spun (e.g., the platen and pad). In certain embodiments, a target torque value may be about 500 Newton-meters or less.

Figure 6:
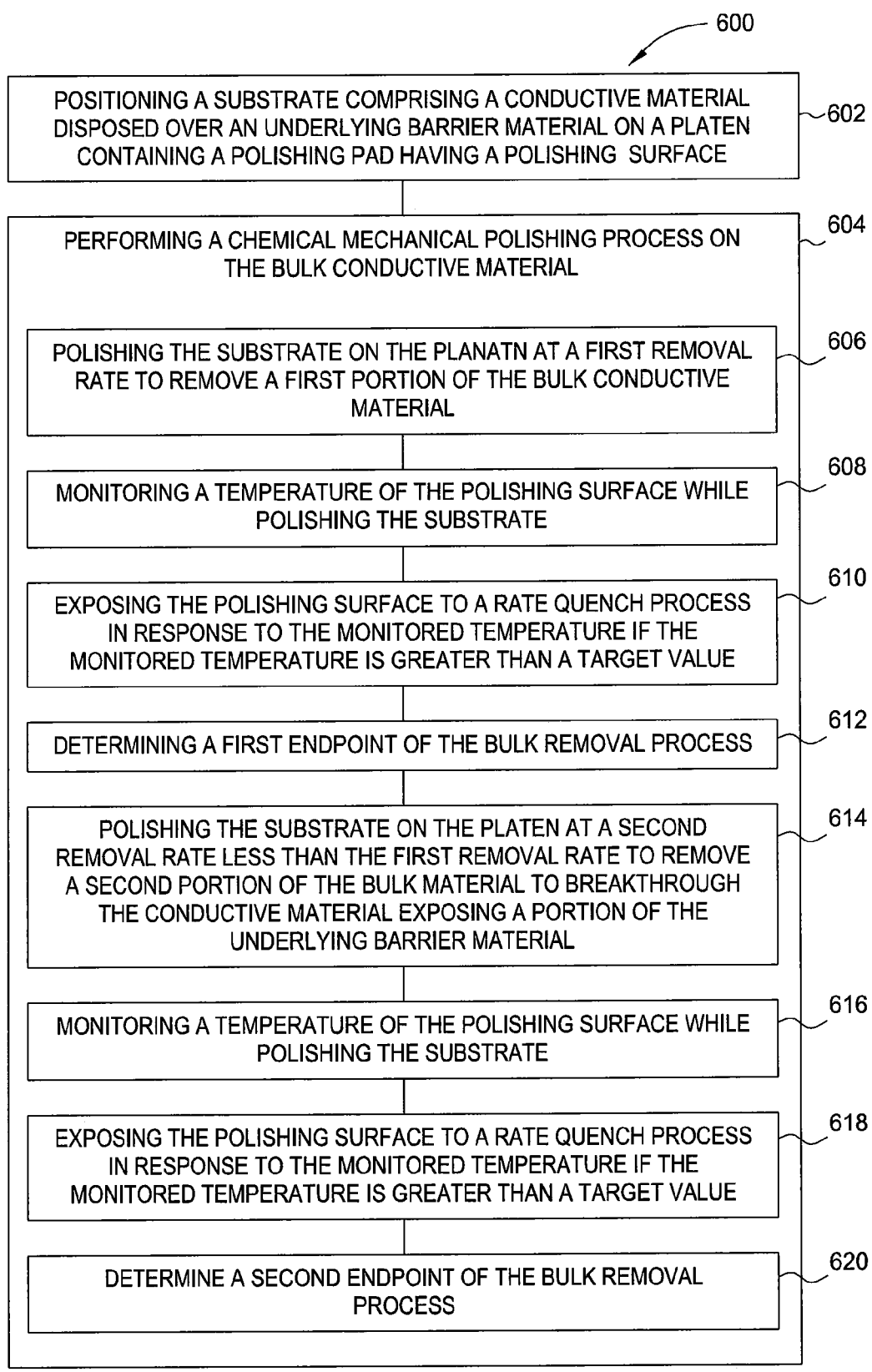
FIG. 6 is a block diagram of one embodiment of a method for chemical mechanical polishing a conductive material.
Figure 6:
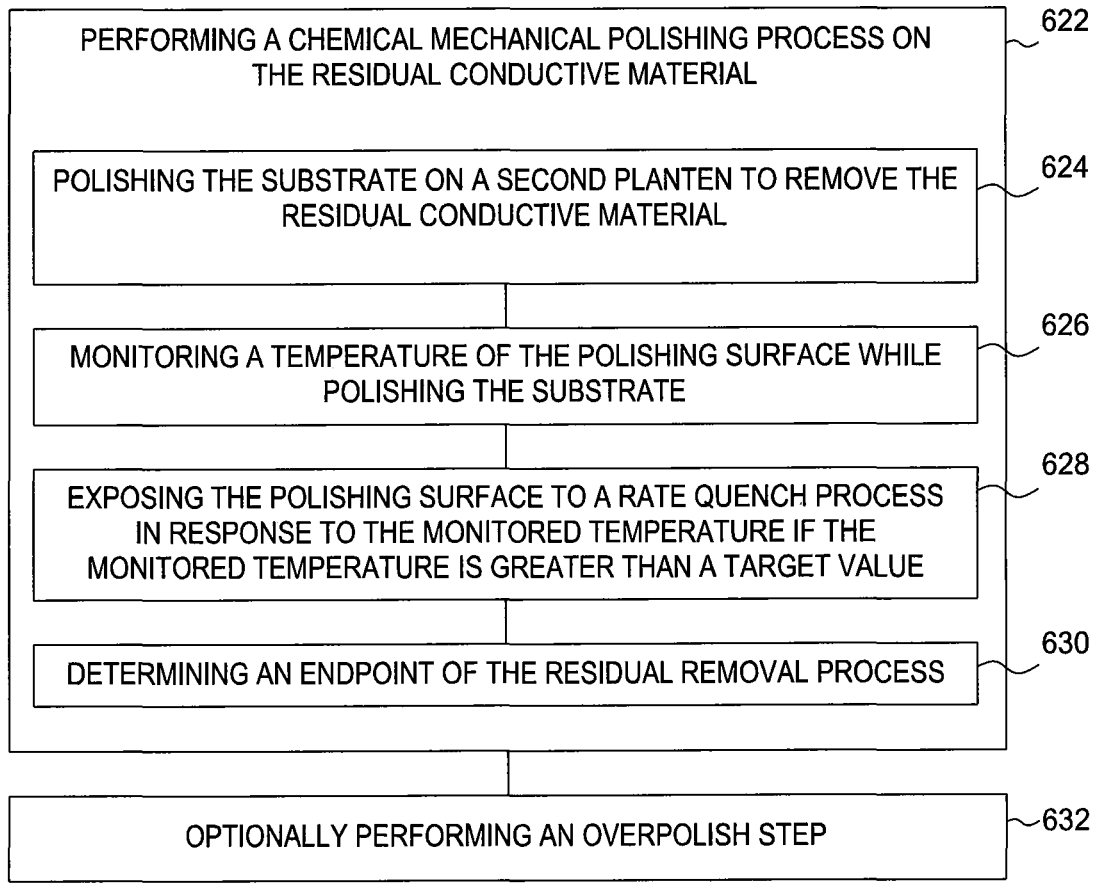

FIG. 6 is a block diagram of one embodiment of a method 600 for chemical mechanical polishing a substrate having an exposed conductive material layer and an underlying barrier layer that may be practiced on the system 100 described above. The method 600 may also be practiced on other chemical mechanical processing systems and other substrate materials. The method 600 is generally stored in the memory 112 of the controller 108, typically as a software routine. The software routine may also be stored and/or executed by a second CPU (not shown) that is remotely located from the hardware being controlled by the CPU 110.

Although embodiments described herein are discussed as being implemented as a software routine, some of the method steps that are disclosed herein may be performed in hardware as well as by the software controller. As such, the embodiments described herein may be implemented in software as executed upon a computer system, in hardware as an application specific integrated circuit or other type of hardware implementation, or a combination of software and hardware.

The method 600 begins at step 602 by positioning a substrate comprising a conductive material disposed over an underlying barrier material on a platen containing a polishing pad having a polishing surface. The conductive layer may comprise tungsten, copper, combinations thereof, and the like. The barrier layer may comprise ruthenium, tantalum, tantalum nitride, titanium, titanium nitride, tungsten nitride, tungsten, combinations thereof, and the like. A dielectric layer, typically an oxide, generally underlies the barrier layer.

In one embodiment, the substrate 122 retained in the carrier head assembly 152 is moved over the polishing pad 214 disposed in one of the CMP stations 128, 130, 132. The carrier head assembly 152 is lowered toward the polishing pad 214 to place the substrate 122 in contact with the polishing surface 234 of the polishing pad 214.

At step 604 a chemical mechanical polishing process is performed on the bulk conductive material. At step 606, the substrate is polished on a first platen at a first removal rate to remove a portion of the bulk conductive material. In one embodiment, the conductive layer is a copper layer having an initial thickness between about 6,000-8,000 Å. In one embodiment, the polishing step 606 may be performed at the first CMP station 128. The substrate 122 may be urged against the polishing pad 214 with a force of less than about 2.5 pounds per square inch (psi). In one embodiment, the force is between about 1 psi and 2 psi, for example, about 1.8 psi.

Next, relative motion between the substrate 122 and polishing pad 214 is provided. In one embodiment, the carrier head assembly 152 is rotated at between about 50-100 revolutions per minute, for example, between about 30-60 revolutions per minute, while the polishing pad 214 is rotated at between about 50-100 revolutions per minute, for example, between about 7-35 revolutions per minute. The process generally has a copper removal rate of about 9,000 Å/min.

A polishing slurry is supplied to the polishing pad 214. In certain embodiments, the polishing slurry may comprise an oxidizer such as hydrogen peroxide or ammonium persulphate, a passivation agent such as a corrosion inhibitor, a pH buffer, a metal complexing agent, abrasives, and combinations thereof. Suitable corrosion inhibitors include compounds having a nitrogen atom (N), such as organic compounds having an azole group. Examples of suitable compounds include benzotriazole (BTA), mercaptobenzotriazole, 5-methyl-1-benzotriazole (TTA), derivatives thereof, and combinations thereof. Other suitable corrosion inhibitors include film forming agents such as, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. The polishing slurry may typically include a corrosion inhibitor such as (BTA).

In certain embodiments, the polishing slurry also contains abrasives such as colloidal silica, alumina, and/or cerria. In certain embodiments, the polishing slurry may additionally comprise surfactants. Examples of suitable polishing compositions and methods for bulk chemical mechanical processes are described in U.S. patent application Ser. No. 11/839,048, entitled IMPROVED SELECTIVE CHEMISTRY FOR FIXED ABRASIVE CMP, filed Aug. 15, 2007, now published as US 2008/0182413 and U.S. patent application Ser.

No. 11/356,352, entitled METHOD AND COMPOSITION FOR POLISHING A SUBSTRATE, now published as US2006/0169597, both of which are herein incorporated by reference to the extent not inconsistent with the current application. In certain embodiments, the substrate 122 contacts the polishing pad 214 after addition of the polishing slurry. In certain embodiments, the substrate 122 contacts the polishing pad 214 prior to the addition of the polishing slurry.

At step 608, a temperature of the polishing surface is monitored while polishing the substrate. The temperature of the polishing surface may be monitored using the control system depicted in FIG. 5A. The temperature of the polishing surface may be continuously monitored throughout the removal of the first portion of the bulk conductive material. The temperature of the polishing surface may be repeatedly monitored at defined intervals throughout the removal of the first portion of the bulk conductive material.

At step 610, the polishing surface is exposed to a rate quench process in response to the monitored temperature if the monitored temperature is greater than a target value. The rate quench process may be performed as described with respect to FIG. 5A. The duration of the rate quench process may vary depending on many factors such as consumables used, removal rate, single or multi-head polish, process temperature, and pad surface area.

At step 612, an endpoint of the bulk portion removal process is determined. In one embodiment, the endpoint of the bulk portion removal process occurs prior to breakthrough of the copper layer. The endpoint may be detected using detection systems such as the iScan™ thickness monitor and the FullScan™ optical endpoint system, both of which are available from Applied Materials, Inc. of Santa Clara, Calif.

An endpoint of the process may also be determined using real time profile control (RTPC). For example, in a CMP process, the thickness of the conductive material at different regions on the substrate may be monitored and detected non-uniformities may cause the CMP system to adjust polishing parameters in real time. RTPC may be used to control the remaining copper profile by adjusting zone pressures in the carrier polishing head. Examples of suitable RTPC techniques and apparatus are described in U.S. Pat. No. 7,229,340, to Hanawa et al. entitled METHOD AND APPARATUS FOR MONITORING A METAL LAYER DURING CHEMICAL MECHANICAL POLISHING and U.S. patent application Ser. No. 10/633,276, entitled EDDY CURRENT SYSTEM FOR IN-SITU PROFILE MEASUREMENT, filed Jul. 31, 2003, now issued as U.S. Pat. No. 7,112,960, all of which are hereby incorporated by reference in their entirety.

In one embodiment the endpoint may be determined using spectrum based endpoint detecting techniques. Spectrum based endpoint techniques include obtaining spectra from different zones on a substrate during different times in a polishing sequence, matching the spectra with indexes in a library and using the indexes to determine a polishing rate for each of the different zones from the indexes. In another embodiment, the endpoint may be determined using a first metric of processing provided by a meter. The meter may provide charge, voltage or current information utilized to determine the remaining thickness of the conductive material (e.g., the copper layer) on the substrate. In another embodiment, optical techniques, such as an interferometer utilizing a sensor may be utilized. The remaining thickness may be directly measured or calculated by subtracting the amount of material removed from a predetermined starting film thickness. In one embodiment, the endpoint is determined by comparing the charge removed from the substrate to a target charge amount for a predetermined area of the substrate. Examples of endpoint techniques that may be utilized are described in U.S. Pat. No. 7,226,339, entitled SPECTRUM BASED ENDPOINTING FOR CHEMICAL MECHANICAL POLISHING, issued Jun. 5, 2007 to Benvegnu et al., U.S. patent application Ser. No. 11/748,825, entitled SUBSTRATE THICKNESS MEASURING DURING POLISHING, filed May 15, 2007, now published as US 2007/0224915, and U.S. Pat. No. 6,924,641, to Hanawa et al., entitled METHOD AND APPARATUS FOR MONITORING A METAL LAYER DURING CHEMICAL MECHANICAL POLISHING, all of which are hereby incorporated by reference in their entireties.

In one embodiment, the remaining copper layer has a thickness between about 1,400 Å to about 2,000 Å. In one embodiment, the first endpoint occurs when the conductive layer has a thickness of about 2,000 Å.

At step 614, a "soft landing" polishing step is performed where the substrate is polished on the platen at a second removal rate less than the first removal rate to breakthrough the conductive material and expose a portion of the underlying barrier material. Although discussed as being performed on the same platen as the step 606 it should be understood that the soft landing step of step 614 may be performed on a separate platen. The soft landing step 614 requires a low copper removal rate. In one embodiment, during the soft landing step, the substrate may be polished at a removal rate between about 1,500-2,500 Å/min, for example, about 1,800 Å/min. In one embodiment, the substrate 122 may be urged against the polishing pad 214 with a down force between about 1.0 psi and 1.6 psi, for example, about 1.3 psi. In one embodiment the flow rate of the polishing slurry may be between about 200 ml/min and about 500 ml/min, for example, between about 250 ml/min and about 350 ml/min.

Uniform slurry distribution provided by the supply delivery tube 126 ensures that the copper ion concentration is low and provides a larger process window. During the soft landing step 614, first breakthrough at the substrate center is desired as the center of the substrate has a larger overpolish window. It is believed that the concentration of polishing by-products, such as copper ions, being removed from the substrate and off of the pad have a higher concentration at the edge of the substrate than at the center of the substrate. Thus, the copper inhibitor residence time at the center of the substrate is longer leading to better passivation. The final endpoint for the bulk conductive material removal process at the first CMP station 128 is at first copper breakthrough. With the copper already broken through, polishing time to remove the remaining conductive layer on the second CMP station 130 is reduced leading to higher wafer throughput. Lower topography also results with less copper material coming to the second CMP station 130 during copper final clearing and field copper residue removal. With less copper to remove on the second platen, the copper ion concentration will be lower. With fewer copper ions, copper inhibitor will be consumed at a lower rate leading to higher copper inhibitor concentrations. With higher copper inhibitor concentrations greater copper inhibitor passivation of the substrate will result leading to lower topography. With less copper ions generated on the second CMP station 130, higher than expected down forces can be used without negatively impacting topography which improves the ability to fully remove field copper residue.

At step 616, a temperature of the polishing surface is monitored while polishing the substrate on the platen at a second removal rate less than the first removal rate. The temperature of the polishing surface may be monitored using the control system depicted in FIG. 5A. The temperature of the polishing surface may be continuously monitored throughout the removal of the second portion of the bulk conductive material. The temperature of the polishing surface may be repeatedly monitored at defined intervals throughout the removal of the second portion of the bulk conductive material.

At step 618, the polishing surface is exposed to a rate quench process in response to the monitored temperature if the monitored temperature is greater than a target value. The rate quench process may be performed as described with respect to step 610 and/or FIG. 5A.

At step 620, an endpoint of the breakthrough process is determined. The second endpoint may be determined using FullScan™ and the other endpoint techniques described herein.

At step 622, a chemical mechanical polishing process is performed on the residual conductive material. The residual conductive material removal process comprises polishing the substrate on a second platen and determining an endpoint of that polishing process. At step 624, the substrate is polished on a second platen to remove any residual conductive material. In one embodiment, the substrate may be polished at a removal rate between about 1,500-2,500 Å/min, for example, about 2,400 Å/min. Step 624 may be a single or multi-step chemical mechanical clearance process. The clearance step 624 may be performed on the second CMP station 130, or one of the other CMP stations 128, 132.

The clearance processing step 624 begins by moving the substrate 122 retained in the carrier head assembly 152 over the polishing pad disposed in the second CMP station 130. The carrier head assembly 152 is lowered toward the polishing pad to place the substrate 122 in contact with the polishing surface of the polishing pad. The substrate 122 is urged against the polishing pad with a force less than about 2 psi. In another embodiment, the force is less than or equal to about 0.3 psi.

Next, relative motion between the substrate 122 and polishing pad is provided. Polishing slurry is supplied to the polishing pad. In one embodiment, the carrier head assembly 152 is rotated at about 30-80 revolutions per minute, for example, about 50 rpms, while the polishing pad is rotated at about 7-90 revolutions per minute, for example, about 53 rpm. The process of step 624 generally has a removal rate of about 1,500 Å/min for tungsten and about 2,000 Å/min for copper.

At step 626, a temperature of the polishing surface is monitored while polishing the substrate. The temperature of the polishing surface may be monitored using the control system depicted in FIG. 5. The temperature of the polishing surface may be continuously monitored throughout the removal of the residual conductive material. The temperature of the polishing surface may be repeatedly monitored at defined intervals throughout the removal of the residual conductive material.

At step 628, the polishing surface is exposed to a rate quench process in response to the monitored temperature if the monitored temperature is greater than a target value. The rate quench process may be performed as described with respect to step 610 and/or FIG. 5A.

At step 630 an endpoint of the residual conductive material removal is determined. The endpoint may be determined using FullScan™ or any of the other techniques discussed above. In one embodiment, for an electrochemical mechanical polishing process (Ecmp), the endpoint is determined by detecting a first discontinuity in current sensed by using a meter. The discontinuity appears when the underlying layer begins to break through the conductive layer (e.g., the copper layer). As the underlying layer has a different resistivity than the copper layer, the resistance across the processing cell (i.e., from the conductive portion of the substrate to the electrode) changes as the area of conductive layer relative to the exposed area of the underlying layer changes, thereby causing a change in the current.

Optionally, in response to the endpoint detection, a second clearance process step may be performed to remove the residual copper layer. The substrate is pressed against the pad assembly with a pressure less than about 2 psi, and in another embodiment, substrate is pressed against the pad assembly with a pressure less than or equal to about 0.3 psi. The process of step generally has a removal rate of about 500 to about 2,000 Å/min, for example, between about 500 to about 1,200 Å/min for both copper and tungsten processes.

Optionally, at step 632, a third clearance process step or "overpolish" may be performed to remove any remaining debris from the conductive layer. The third clearance process step is typically a timed process, and is performed at a reduced pressure. In one embodiment, the third clearance process step (also referred to as an overpolish step) has a duration of about 10 to about 30 seconds.

Following the residual conductive material removal step 622, a barrier polish may be performed. In one embodiment, the barrier polish may be performed on the third CMP station 132, but may alternatively be performed one of the other CMP stations 128, 130.

In another embodiment, this process may be adapted for a one platen copper clear process. The process may be applied as a 2 step process with a copper ion quench step in between. RTPC for good copper remaining profile may be used along with DSDA to ensure good copper inhibitor coverage across the wafer to help reduce the copper removal rate by more effectively diluting copper ions providing good copper passivation across the wafer leading to good topography. It is important to control the balance of copper ions and copper inhibitor concentration during copper breakthrough and clearing.

Figure 7:
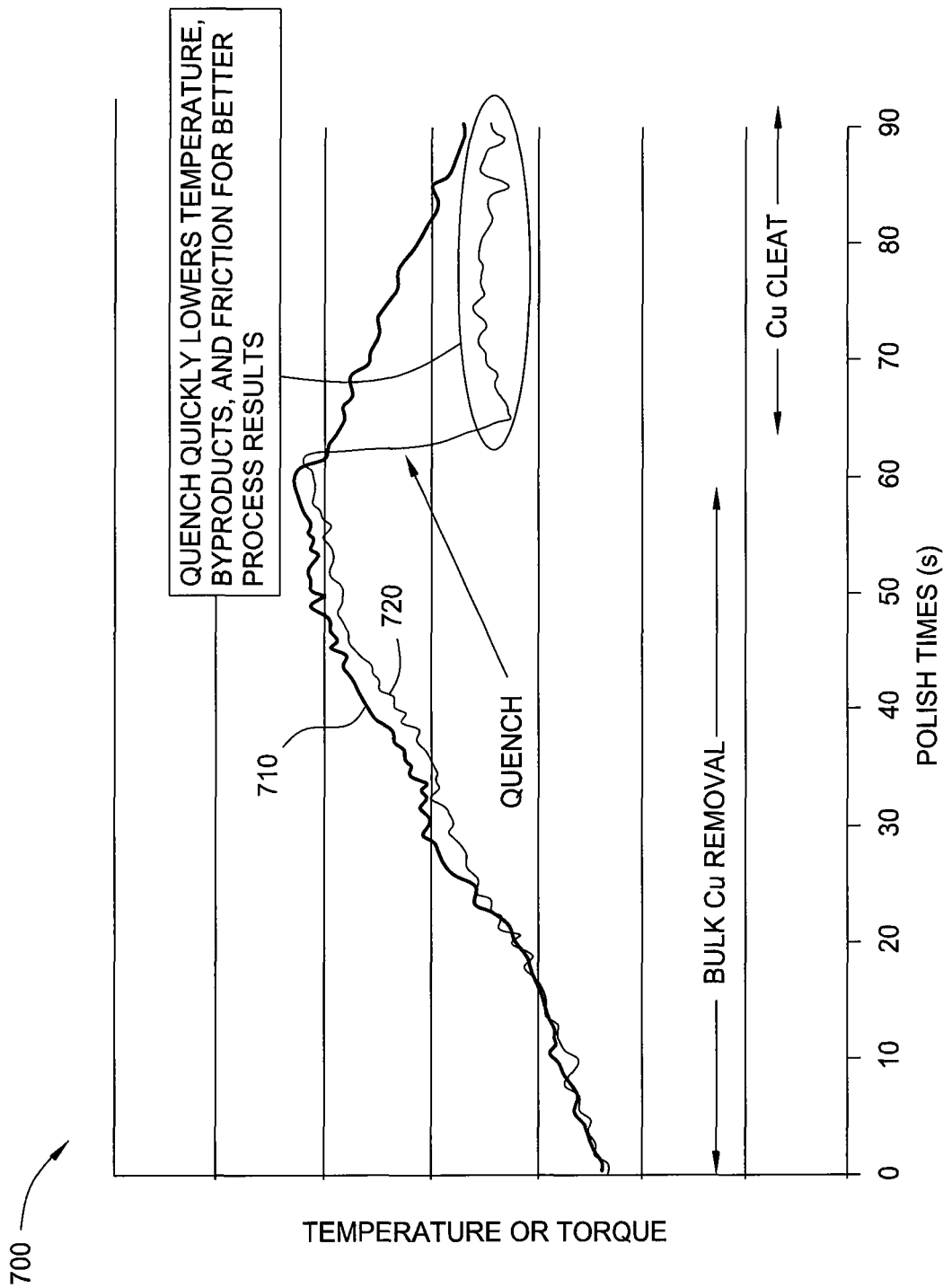
FIG. 7 is a plot depicting the effect of a quench process on temperature or torque during a chemical mechanical polishing process.

FIG. 7 is a plot 700 depicting the effect of a quench process on temperature or torque during a chemical mechanical polishing process. The x-axis represents polishing time in seconds and the y-axis represents temperature or torque. Line 710 represents temperature as a function of time for a chemical mechanical polishing process performed without a quench process. Line 720 represents temperature as a function of time for a chemical mechanical process performed with a quench process as described herein. As depicted by line 720, the quench process quickly lowers the temperature, by-products and friction for better process results.

FIG. 8 is a plot 800 depicting the effect of a quench process on temperature during a chemical mechanical polishing process. The x-axis represents polishing time in seconds and the y-axis represents temperature (° C.). Line 810 represents temperature as a function of time for a chemical mechanical polishing process performed without a quench process. Line 820 represents temperature as a function of time for a chemical mechanical process performed with multiple quench points 830, 840 where a quench process as described herein is commenced. As depicted by line 820, the multiple quench processes quickly lower the temperature, by-products and friction for improved process results.

While the foregoing is directed to embodiments of the present invention, other and further embodiments of the invention may be devised without departing from the basic scope thereof, and the scope thereof is determined by the claims that follow.

We claim:

1. A method for chemical mechanical polishing (CMP) of a conductive material disposed on one or more substrates, the method comprising:
   polishing the one or more substrates against a polishing surface in the presence of a polishing fluid during a polishing process to remove a portion of the conductive material;
   monitoring a temperature of the polishing surface during the polishing process; and
   exposing the polishing surface to a rate quench process in response to the monitored temperature so as to maintain the temperature of the polishing surface at a target value during the polishing process, wherein the rate quench process comprises increasing a concentration of a corrosion inhibitor in the polishing fluid.

2. The method of claim 1, wherein the target value for the monitored temperature is about 50 degrees Celsius or less.

3. The method of claim 1, wherein the polishing surface is exposed to the rate quench process when the monitored temperature is greater than the target value.

4. The method of claim 3, wherein the rate quench process is ceased when the monitored temperature is below the target value.

5. The method of claim 1, wherein the polishing process comprises at least one of: polishing the one or more substrates to remove a bulk portion of the conductive material, polishing the one or more substrates to breakthrough the conductive material and expose a portion of an underlying barrier material, and polishing the one or more substrates to remove residual conductive material from the underlying barrier material.

6. The method of claim 5, wherein the polishing process is performed on a single platen.

7. The method of claim 5, wherein polishing the one or more substrates to remove a bulk portion of the conductive material and polishing the one or more substrates to breakthrough the conductive material and expose a portion of an underlying material are performed on the same platen.

8. A method for chemical mechanical polishing (CMP) of a conductive disposed on one or more substrates, the method comprising:
   polishing the one or more substrates against a polishing surface in the presence of a polishing fluid during a polishing process to remove a portion of the conductive material;
   monitoring a temperature of the polishing surface during the polishing process; and
   exposing the polishing surface to a rate quench process in response to the monitored temperature so as to maintain the temperature of the polishing surface at a target value during the polishing process, wherein the rate quench process comprises rinsing the polishing surface with deionized water.

9. The method of claim 8, wherein the flow rate of deionized water is between about 500 mL/minute to about 12 liters/minute.

10. The method of claim 8, wherein the target value for the monitored temperature is about 50 degrees Celsius or less.

11. The method of claim 8, wherein the polishing surface is exposed to the rate quench process when the monitored temperature is greater than the target value.

12. The method of claim 11, wherein the rate quench process is ceased when the monitored temperature is below the target value.

13. The method of claim 8, wherein the polishing process comprises at least one of: polishing the one or more substrates to remove a bulk portion of the conductive material, polishing the one or more substrates to breakthrough the conductive material and expose a portion of an underlying barrier material, and polishing the one or more substrates to remove residual conductive material from the underlying barrier material.

14. The method of claim 13, wherein the polishing process is performed on a single platen.

15. The method of claim 13, wherein polishing the one or more substrates to remove a bulk portion of the conductive material and polishing the one or more substrates to breakthrough the conductive material and expose a portion of an underlying material are performed on the same platen.

16. A method for chemical mechanical polishing (CMP) of a conductive material disposed on one or more substrates, the method comprising:
   polishing one or more substrates having a conductive material disposed over an underlying barrier material on a polishing surface of a polishing pad in the presence of a polishing fluid to remove a portion of the conductive material, the polishing pad supported on a first platen;
   monitoring a temperature of the polishing surface of the polishing pad while polishing the one or more substrates on the polishing pad; and
   exposing the polishing surface of the polishing pad to a rate quench process in response to the temperature of the polishing surface exceeding a target value while polishing the substrate on the polishing pad, wherein the rate quench process comprises increasing a concentration of a corrosion inhibitor in the polishing fluid.

17. The method of claim 16, further comprising:
   polishing the one or more substrates on a second platen to clear the conductive material from the underlying barrier material.

18. The method of claim 16, further comprising:
   polishing the one or more substrates on the first platen to clear the conductive material from the underlying barrier material.

19. The method of claim 16, wherein the one or more substrates comprise a plurality of substrates and the plurality of substrates are simultaneously polished.

20. The method of claim 16, wherein the target value for the monitored temperature is about 50 degrees Celsius or less.

21. A method for chemical mechanical polishing (CMP) of a conductive material disposed on one or more substrates, the method comprising:
   polishing one or more substrates having a conductive material disposed over an underlying barrier material on a polishing surface of a polishing pad in the presence of a polishing fluid to remove a portion of the conductive material, the polishing pad supported on a first platen;
   monitoring a temperature of the polishing surface of the polishing pad while polishing the one or more substances on the polishing pad; and
   exposing the polishing surface of the polishing pad to a rate quench process in response to the temperature of the polishing surface exceeding a target value while polishing the substrate on the polishing pad, wherein the rate quench process comprises rinsing the polishing pad with ionized water.

22. The method of claim 21, further comprising:
   polishing the one or more substrates on a second platen to clear the conductive material from the underlying barrier material.

23. The method of claim 21, further comprising:
polishing the one or more substrates on the first platen to clear the conductive material from the underlying barrier material.

24. The method of claim 21, wherein the one or more substrates comprise a plurality of substrates and the plurality of substrates are simultaneously polished.

25. The method of claim 21, wherein the target value for the monitored temperature is about 50 degrees Celsius or less.

\* \* \* \* \*

UNITED STATES PATENT AND TRADEMARK OFFICE
CERTIFICATE OF CORRECTION

PATENT NO.      : 9,005,999 B2
APPLICATION NO. : 13/539344
DATED           : April 14, 2015
INVENTOR(S)     : Xu et al.

It is certified that error appears in the above-identified patent and that said Letters Patent is hereby corrected as shown below:

In the Claims:

Column 20, Claim 21, Lines 55-56, please delete "substances" and insert -- substrates -- therefor;

Column 20, Claim 21, Line 63, please delete "ionized" and insert -- deionized -- therefor.

Signed and Sealed this
Twentieth Day of October, 2015

Michelle K. Lee
*Director of the United States Patent and Trademark Office*